United States Patent
Aronowitz et al.

(10) Patent No.: US 6,331,468 B1
(45) Date of Patent: Dec. 18, 2001

(54) FORMATION OF INTEGRATED CIRCUIT STRUCTURE USING ONE OR MORE SILICON LAYERS FOR IMPLANTATION AND OUT-DIFFUSION IN FORMATION OF DEFECT-FREE SOURCE/DRAIN REGIONS AND ALSO FOR SUBSEQUENT FORMATION OF SILICON NITRIDE SPACERS

(75) Inventors: Sheldon Aronowitz, San Jose; Helmut Puchner, Santa Clara; Ravindra A. Kapre, San Jose; James P. Kimball, San Jose, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/076,399

(22) Filed: May 11, 1998

(51) Int. Cl.$^7$ .................................................. H01L 21/336

(52) U.S. Cl. .................. 438/287; 438/591; 438/595; 438/653; 438/776; 438/786

(58) Field of Search ...................................... 438/301, 303, 438/305, 306, 265, 290, 216, 287, 591, 595, 653, 776, 786; 257/411, 410

(56) References Cited

U.S. PATENT DOCUMENTS

| | | | |
|---|---|---|---|
| 4,060,427 | * 11/1977 | Barile et al. | 148/1.5 |
| 4,102,733 | * 7/1978 | De La Moneda et al. | 156/653 |
| 4,272,880 | * 6/1981 | Pashley | 29/571 |
| 4,298,629 | * 11/1981 | Nozaki et al. | 427/39 |
| 4,330,931 | * 5/1982 | Liu | 29/571 |
| 4,382,827 | * 5/1983 | Romano-Moran et al. | 148/1.5 |
| 4,402,761 | * 9/1983 | Feist | 148/1.5 |
| 4,455,742 | * 6/1984 | Williams et al. | 29/576 B |

(List continued on next page.)

FOREIGN PATENT DOCUMENTS

361183953 * 8/1986 (JP) .............................. H01L/27/10

Primary Examiner—Olik Chaudhuri
Assistant Examiner—Anh Duy Mai
(74) Attorney, Agent, or Firm—John P. Taylor

(57) ABSTRACT

A process is described for using a silicon layer as an implant and out-diffusion layer, for forming defect-free source/drain regions in a semiconductor substrate, and also for subsequent formation of silicon nitride spacers. A nitrogen-containing dopant barrier layer is first formed over a single crystal semiconductor substrate by nitridating either a previously formed gate oxide layer, or a silicon layer formed over the gate oxide layer, to form a barrier layer comprising either a silicon, oxygen, and nitrogen compound or a compound of silicon and nitrogen. The nitridating may be carried out using a nitrogen plasma followed by an anneal. A polysilicon gate electrode is then formed over this barrier layer, and the exposed portions of the barrier layer remaining are removed. An amorphous silicon layer of predetermined thickness is then formed over the substrate and polysilicon gate electrode. This amorphous layer is then implanted with a dopant capable of forming a source/drain region in the underlying silicon substrate by subsequent diffusion of the implanted dopant from the amorphous silicon layer into the substrate. The structure is then annealed to diffuse the dopant from the implanted silicon layer into the substrate to form the desired source/drain regions and into the polysilicon gate electrode to dope the polysilicon. The annealing further serves to cause the amorphous silicon layer to crystalize to polycrystalline silicon (polysilicon). In one embodiment, the polysilicon layer is then nitridized to convert it to a silicon nitride layer which is then patterned to form silicon nitride spacers on the sidewalls of the polysilicon gate electrode to electrically insulate the gate electrode from the source/drain regions. The process may be further modified to also create LDD or HDD source/drain regions in the substrate (depending on the concentration of the dopant), using multiple implants into the same silicon layer or by the sequential use of several silicon layers, each of which is used as an implantation and out-diffusion layer.

18 Claims, 9 Drawing Sheets

U.S. PATENT DOCUMENTS

| | | | | |
|---|---|---|---|---|
| 4,512,074 | * | 4/1985 | Sasaki | 29/576 |
| 4,542,580 | * | 9/1985 | Delivorias | 29/590 |
| 4,589,936 | * | 5/1986 | Komatsu | 148/188 |
| 4,621,277 | * | 11/1986 | Ito et al. | 357/54 |
| 4,623,912 | * | 11/1986 | Chang et al. | 357/54 |
| 4,629,520 | * | 12/1986 | Ueno et al. | 148/188 |
| 4,715,937 | * | 12/1987 | Moslehi et al. | 204/177 |
| 4,775,642 | * | 10/1988 | Chang et al. | 438/258 |
| 4,835,112 | * | 5/1989 | Pfiester et al. | 438/305 |
| 5,093,700 | * | 3/1992 | Sakata | 357/23.1 |
| 5,168,072 | * | 12/1992 | Moslehi | 438/300 |
| 5,180,690 | * | 1/1993 | Czubatyj et al. | 438/485 |
| 5,266,514 | * | 11/1993 | Tuan et al. | 438/398 |
| 5,276,347 | * | 1/1994 | Wei et al. | 257/388 |
| 5,326,722 | * | 7/1994 | Huang | 438/299 |
| 5,600,166 | * | 2/1997 | Clementi et al. | 257/324 |
| 5,683,929 | * | 11/1997 | Ohi et al. | 438/396 |
| 5,792,690 | * | 8/1998 | Sung | 438/253 |
| 5,915,182 | * | 6/1999 | Wu | 438/299 |
| 5,969,397 | * | 10/1999 | Grider, III et al. | 257/410 |
| 6,015,740 | * | 1/2000 | Milic-Strkalj | 438/300 |

* cited by examiner

FORMATION OF INTEGRATED CIRCUIT STRUCTURE USING ONE OR MORE SILICON LAYERS FOR IMPLANTATION AND OUT-DIFFUSION IN FORMATION OF DEFECT-FREE SOURCE/DRAIN REGIONS AND ALSO FOR SUBSEQUENT FORMATION OF SILICON NITRIDE SPACERS

BACKGROUND OF THE INVENTION

1. Field of the Invention

This invention relates to the production of integrated circuit structures on a semiconductor substrate. More particularly it relates to the use of one or more silicon layers in the formation of defect-free source/drain regions, by implantation and out-diffusion of the one or more silicon layers into the substrate, and later formation of silicon nitride spacers from the one or more silicon layers.

2. Description of the Related Art

As geometries of integrated circuit structures have been reduced, the contribution of defects in a single crystal silicon semiconductor substrate, created during implantation of the substrate to form source/drain regions of an MOS device, gains in importance because such implant-caused crystal defects in a single crystal semiconductor substrate, such as a single crystal silicon substrate, adversely affect the subsequent dopant diffusion in the lightly doped drain (LDD) or heavily doped drain (HDD), and into channel regions of such an MOS device formed in the substrate.

While it is known to implant a sacrificial diffusion layer on a single crystal semiconductor substrate followed by out-diffusion of the dopant from the diffusion layer into the substrate to thereby isolate the implantation-generated defects from the substrate, some manner of protection must be afforded to the channel region of the substrate under the gate electrode during concurrent implantation of a polysilicon gate electrode and then diffusion of the dopant into and through the gate electrode during annealing to concurrently form the source/drain regions in the substrate. This is a particular problem since such dopants may diffuse at a faster rate through the polysilicon gate electrode (toward the underlying channel region) than the dopants diffusing into the single crystal semiconductor deep enough to form the desired source/drain regions.

Pending Aronowitz et al. U.S. patent application Ser. No. 08/816,254, filed by one of us on Mar. 13, 1997, and assigned to the assignee of this invention, the disclosure of which is hereby incorporated by reference, discusses the problems of protecting the underlying channel area of a semiconductor substrate during doping of the gate electrode. The above-referenced Aronowitz et al. patent application suggests and claims the formation of a nitridized silicon barrier layer over the gate oxide and beneath the polysilicon gate electrode by the treating, with a nitrogen plasma, of a thin layer of silicon formed over the gate oxide to thereby form a nitridized silicon dopant barrier layer. This nitridized silicon layer then prevents penetration of the gate electrode dopant through the barrier layer into the gate oxide, and the channel region of the substrate beneath the gate oxide during the annealing step.

While the above-referenced Aronowitz et al. patent application addresses the problem of dopant diffusion into the channel region of a single crystal substrate below the gate electrode, the use of an implant and out-diffusion layer over the substrate and the gate electrode still introduces additional process steps in the formation and subsequent removal of such a layer. While it has been proposed to subsequently use such an implant and out-diffusion layer (when the layer comprises silicon) in the formation of metal silicide contacts, this is not always useful or desirable, thus necessitating removal of the implant and out-diffusion layer after formation of the source/drain regions, which adds to the complexity and expense of the process.

It would be desirable if the problem of implant-caused defects in the substrate could be rectified by the use of an implantation and outdiffusion layer over the substrate which layer could not only be used in the formation of source/drain regions of varying dopant density, but then further used in the formation of a desired component of the integrated circuit structure, other than a metal silicide contact.

SUMMARY OF THE INVENTION

In accordance with the invention, a nitrogen-containing dopant barrier layer is first formed over a single crystal semiconductor substrate by exposing either a previously formed gate oxide layer, or a silicon layer formed over the gate oxide layer, to a nitrogen plasma to form a barrier layer comprising either a silicon, oxygen, and nitrogen compound or a compound of silicon and nitrogen. A polysilicon gate electrode is then formed over this barrier layer, and the exposed portions of the barrier layer remaining are removed. An amorphous silicon layer of predetermined thickness is then formed over the substrate and polysilicon gate electrode. This amorphous layer is then implanted with a dopant capable of forming a source/drain region in the underlying silicon substrate by subsequent diffusion of the implanted dopant from the amorphous silicon layer into the substrate. The structure is then annealed to diffuse the dopant from the implanted silicon layer into the substrate to form the desired source/drain regions and into the polysilicon gate electrode to dope the polysilicon. The annealing further serves to cause the amorphous silicon layer to crystalize to polycrystalline silicon (polysilicon). The resulting polysilicon layer is then nitridized to convert it to a silicon nitride layer which is then patterned to form silicon nitride spacers on the sidewalls of the polysilicon gate electrode to electrically insulate the gate electrode from the source/drain regions.

In another embodiment, the exposed portions of the gate oxide layer are not removed after definition of the polysilicon gate. In this embodiment, the presence of the gate oxide layer under the implanted amorphous silicon layer results in less dopant being diffused into the substrate during the annealing step, thus creating LDD or HDD source/drain regions in the substrate (depending on the concentration of the dopant). As in the earlier embodiment, the annealed silicon layer is then exposed to a nitrogen plasma to convert it to a silicon nitride which is then anisotropically etched to form first silicon nitride spacers on the sidewalls of the gate electrode. However, in this embodiment, a further layer of amorphous silicon is then deposited over the structure (after formation of the first silicon nitride spacers), implanted with a further dosage of the same dopant at a higher dosage level than the first implant, and the structure is then annealed to diffuse the further dosage of dopant into the substrate to form the source/drain regions, as well as to convert the second amorphous silicon layer to a polysilicon layer. This resulting second polysilicon layer is then also nitridized to form a further layer of silicon nitride which is then anisotropically etched to form a second set of silicon nitride spacers adjacent and contiguous with the first set of silicon nitride spacers. The resulting structure has doped source/drain regions in the substrate formed from the higher dosage level of implanted dopant in the second amorphous silicon layer, and separated from the channel beneath the polysilicon gate electrode by the less highly doped (e.g., LDD or HDD) regions formed during the first doping of the substrate with the lower dosage of dopant.

In yet a third embodiment of the invention, after formation of the gate oxide, a portion of the gate oxide is masked, leaving an unmasked portion larger than the subsequently formed gate electrode. A barrier layer is then formed over this unmasked portion of the gate oxide, by nitridating the unmasked portion of the gate oxide. The polysilicon gate electrode is then formed, and then an amorphous silicon layer is deposited over the structure. However, in this embodiment, the amorphous silicon layer is then subject to two implants for N channel device formation. A heavy dosage of arsenic is implanted together with a lighter dosage of phosphorus. The structure is then annealed to cause the implanted dopants to diffuse through the gate oxide (where present) into the substrate causing the formation of source/drain layers beneath the doped amorphous silicon layer by the implanted arsenic atoms, as well as the implanted phosphorus atoms. However, due to the enhanced mobility of the smaller phosphorus atoms, there will be lateral migration of the phosphorus atoms beneath the silicon nitride barrier layer and toward the channel region. Since there was a lighter dosage of the phosphorus atoms, however, the doped regions formed by this lateral migration of phosphorus atoms will be of lower dopant concentration, i.e., will form LDD or HDD regions between the heavily doped source/drain regions (formed by the higher dosage of arsenic dopant) and the channel region below the gate electrode. As with the other embodiments, the amorphous layer (now annealed to form a polysilicon layer) is nitridized to form silicon nitride which is then subject to an anisotropic etch to form the desired silicon nitride spacers on the sidewalls of the polysilicon electrode.

DETAILED DESCRIPTION OF THE INVENTION

Figure 1:
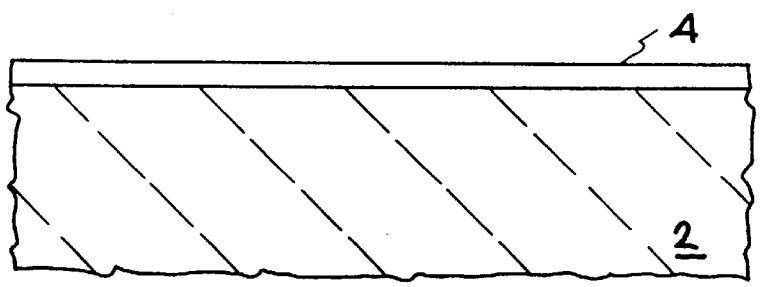
FIG. 1 is a fragmentary vertical cross-sectional view of a semiconductor substrate having a silicon oxide gate oxide layer thereon.
Figure 2A:
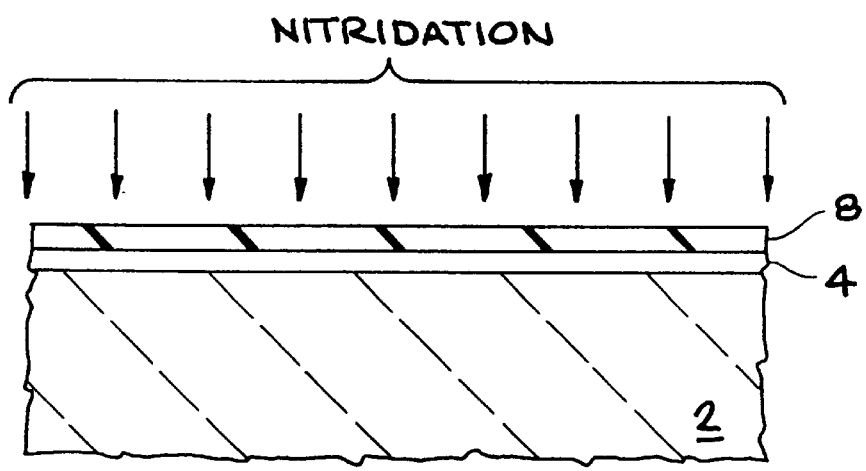
FIG. 2A is a fragmentary vertical cross-sectional view of the structure of FIG. 1 after a layer of amorphous silicon has been deposited over the gate oxide layer and the layer of amorphous silicon has been nitridized to form a barrier layer of a silicon and nitrogen compound over the gate oxide layer.
Figure 2B:
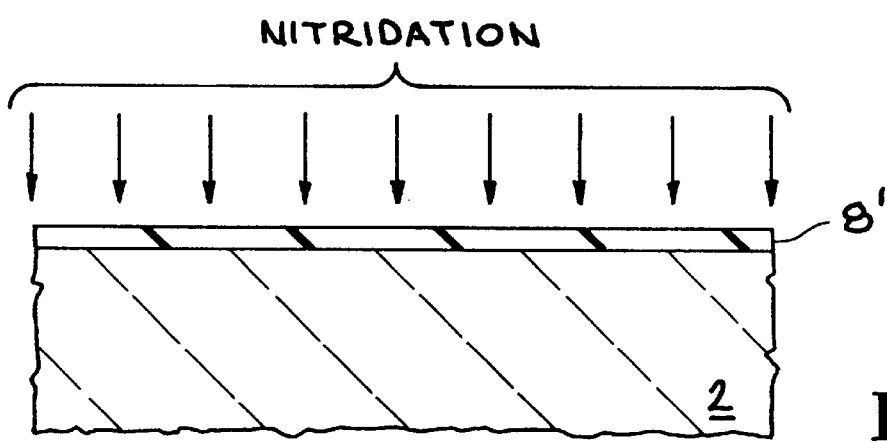
FIG. 2B is a fragmentary vertical cross-sectional view of the structure of FIG. 1 after nitridating the gate oxide layer to form a barrier layer of a silicon, oxygen, and nitrogen compound thereon.
Figure 3:
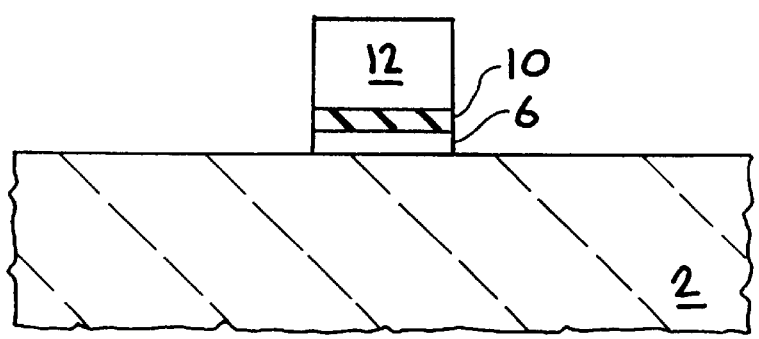
FIG. 3 is a fragmentary vertical cross-sectional view of the structure of FIG. 2A after forming a gate electrode over the silicon and nitrogen barrier layer, and then removing exposed portions of the barrier layer and portions of the gate oxide layer exposed by the gate electrode formation.

Referring now to the drawings, in FIG. 1, a silicon oxide gate oxide layer 4 of conventional thickness, i.e., from about 2 nm (20 Angstroms) to about 4 nm (40 Angstroms), is shown formed over a single crystal semiconductor substrate such as a single crystal silicon substrate. A nitrogen-containing dopant barrier layer is then formed over single crystal semiconductor substrate 2. In FIG. 2A, nitrogen-containing barrier layer 8 is formed by depositing a silicon layer (not shown, but indicated as layer 7 in FIG. 9) over gate oxide layer 4, and then nitridating this silicon layer (by exposing it to a nitrogen plasma), to form barrier layer 8 comprising a compound of silicon and nitrogen. Alternatively, as illustrated in FIG. 2B, the silicon oxide layer my be nitridized to form barrier layer 8' comprising a compound containing silicon, oxygen, and nitrogen. By way of illustration, and not of limitation, the remainder of the process, however, will be shown (in FIGS. 3–8) having nitridized silicon barrier layer 8 formed over gate oxide layer 4.

The nitridating of the silicon layer formed over gate oxide layer 4 to form the silicon and nitrogen barrier layer 8 (or the nitridating of gate oxide layer 4 to form the silicon, oxygen, and nitrogen barrier layer 8') may be carried out by exposing the layer to a remote nitrogen plasma (if silicon is to be nitridized a direct plasma may be used) for a time period ranging from about 10 seconds to about 10 minutes at an inductive coupled plasma power level ranging from about 100 watts to about 400 watts, and an RF bias power on single crystal semiconductor substrate 2 of from about 8 watts to about 20 watts in order to minimize sputtering the exposed material.

While the nitridating of the silicon layer (or the silicon oxide (gate oxide) layer) is not intended to necessarily create stoichiometric silicon nitride (or stoichiometric silicon oxynitride), the total amount of nitrogen so incorporated into the silicon layer (or the silicon oxide layer) should be approximately equal to the amount of nitrogen in the respective stoichiometric compounds.

A polysilicon gate electrode 12 is then formed over barrier layer 8, and the exposed portions of barrier layer 8 remaining are removed, leaving barrier layer portion 10 beneath gate electrode 12. Optionally, those portions of gate oxide layer 4 exposed by the patterning of gate electrode 12 (and by the removal of exposed portions of barrier layer 8) may also be removed, leaving gate oxide portion 6 remaining beneath barrier layer portion 10, as shown in FIGS. 3–8.

Figure 4:
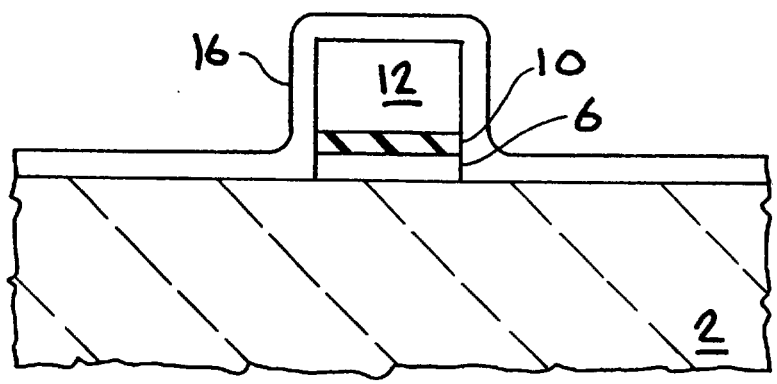
FIG. 4 is a fragmentary vertical cross-sectional view of the structure of FIG. 3 after forming a layer of amorphous silicon over the structure of FIG. 3.

An amorphous silicon layer 16, of predetermined thickness, is then formed over substrate 2 and polysilicon gate electrode 12, as illustrated in FIG. 4. Amorphous silicon layer 16 is then implanted with a dopant capable of forming source/drain regions in underlying substrate 2 by subsequent diffusion of the implanted dopant from amorphous silicon layer 16 into substrate 2 and into polysilicon gate electrode 12. The thickness of amorphous silicon layer 16, which may range from as little as about 30 nm (300 Angstroms) to as much as 150 nm (1500 Angstroms), is preselected, depending upon the implant energy of the implanted dopant (to ensure that the implanted dopant atoms do not pass through the amorphous silicon layer to penetrate—and damage—the substrate), and the thickness (width) of the desired silicon nitride sidewall spacers for gate electrode 12, as will be further described below.

It should be noted that the deposition of a silicon layer as a "layer of amorphous silicon" will be repeatedly referred to herein. The deposition of amorphous silicon, rather than polysilicon, is related to the desire to more accurately control the thickness of the deposited silicon layer which, in turn, requires the use of a low temperature during the deposition. The use of a deposition temperature below about 570° C. results in the formation of an amorphous silicon layer rather than a crystalline silicon layer since crystallization of silicon does not normally occur at deposition temperatures below about 570° C. Preferably the deposition temperature is maintained below about 540° C. to more accurately control the thickness of the deposited amorphous silicon.

Figure 5:
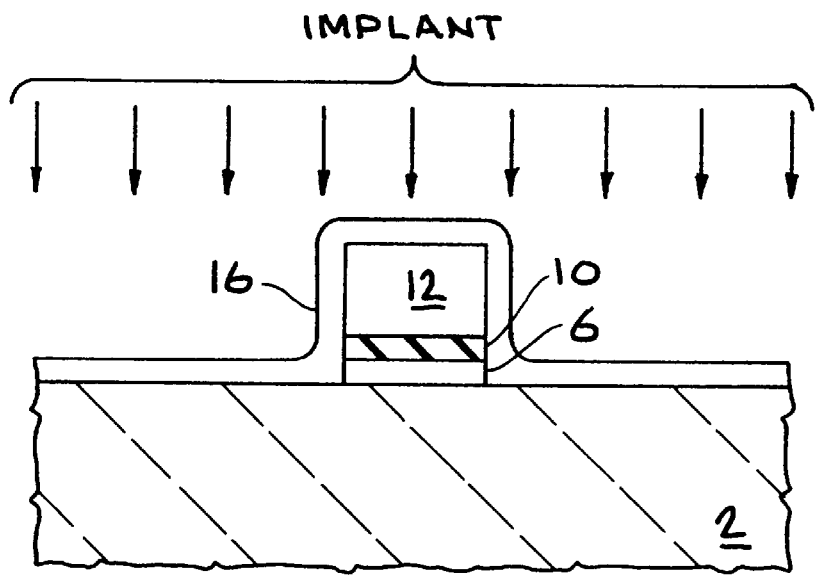
FIG. 5 is a fragmentary vertical cross-sectional view of the structure of FIG. 4 showing the amorphous silicon layer of FIG. 4 being subjected to an implant by a dopant capable of subsequently forming source/drain regions in the underlying substrate.

As shown in FIG. 5, amorphous silicon layer 16 is then implanted with a suitable dopant, depending upon the desired conductivity type of the source/drain regions to be formed in substrate 2. For example, when P type source/drain regions are desired, the substrate can be doped with boron atoms. The implant energy for boron atoms may range from about 5 KeV to about 30 KeV, and the boron total dopant concentration may vary from about $1 \times 10^{19}$ atoms/$cm^3$ to about $1 \times 10^{21}$ atoms/$cm^3$. When N type source/drain regions are to be formed, arsenic or phosphorus atoms may be used (or in some instances both, as will be described below). When arsenic atoms are implanted, the implant energy for arsenic atoms may range from about 5 KeV to about 80 KeV, and the arsenic total dopant concentration may vary from about $1\times10^{19}$ atoms/cm$^3$ to about $1\times10^{21}$ atoms/cm$^3$. When phosphorus atoms are implanted, the implant energy for phosphorus atoms may range from about 5 KeV to about 50 KeV, and the phosphorus total dopant concentration may vary from about $1\times10^{19}$ atoms/cm$^3$ to about $1\times10^{21}$ atoms/cm$^3$.

Figure 6:
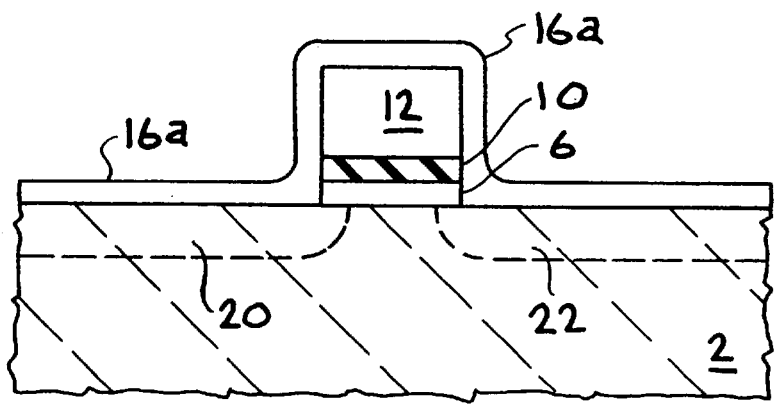
FIG. 6 is a fragmentary vertical cross-sectional view of the structure of FIG. 5 after annealing the structure to diffuse the dopant from the amorphous silicon layer into the substrate to form source/drain regions, and to crystallize the amorphous silicon into polysilicon.

The structure is then annealed, as shown in FIG. 6, to diffuse the dopant from the implanted silicon layer into the substrate to form the desired source/drain regions 20 and 22 in substrate 2, and into polysilicon gate electrode 12 to dope the polysilicon. The anneal may be carried out under conventional conditions for diffusion of implanted dopant, e.g., at a temperature ranging from at least about 800° C. to as high as 1100° C. for a period of time ranging from about 20 minutes to about 60 minutes. Rapid thermal annealing (RTA) may be used for low thermal budgets in which case the temperature would range from about 900° C. to about 1150° C. for a period of from about 1 second to about 60 seconds.

Figure 7:
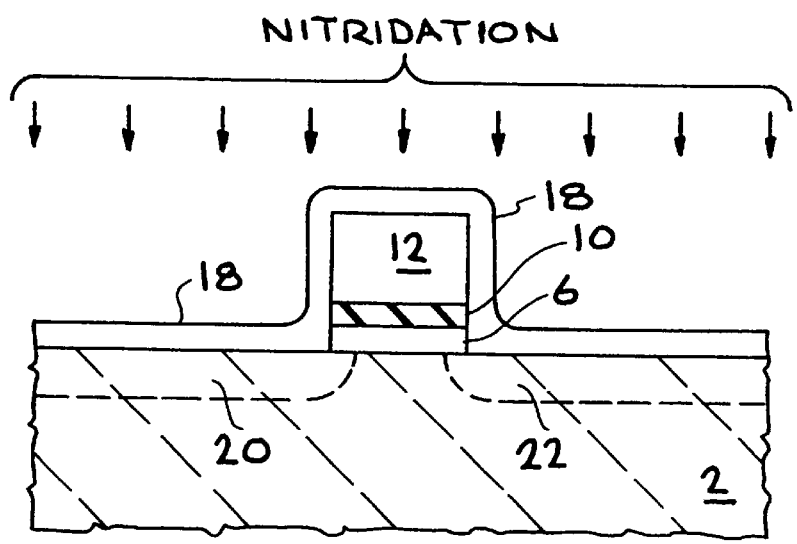
FIG. 7 is a fragmentary vertical cross-sectional view of the structure of FIG. 6 showing the polysilicon layer being nitridized to convert it to a silicon nitride compound.
Figure 8:
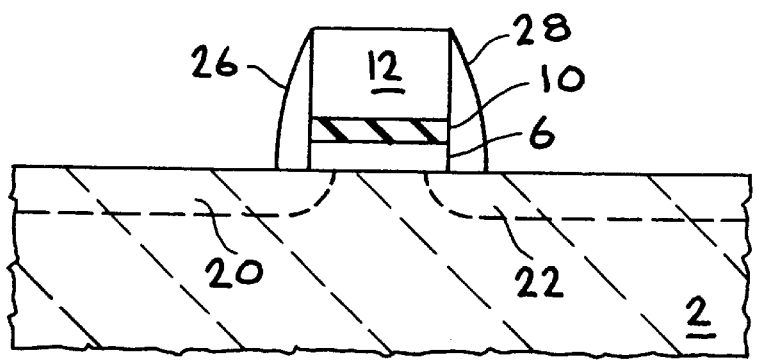
FIG. 8 is a fragmentary vertical cross-sectional view of the structure of FIG. 7, after subjecting the silicon nitride layer formed in FIG. 7 to an anisotropic etch to form silicon nitride spacers on the sidewall of the polysilicon gate electrode.

The annealing further serves to cause amorphous silicon layer 16 to crystalize to polycrystalline silicon (polysilicon). As shown in FIG. 7, the resulting polysilicon layer 16a is then nitridized, under one of the nitridating conditions previously described above, to convert it to silicon nitride layer 18. Silicon nitride layer 18 is then subject to an anisotropic etch to form silicon nitride spacers 26 and 28 on the sidewalls of the polysilicon gate electrode 12 to electrically insulate gate electrode 12 from source/drain regions 20 and 22, as shown in FIG. 8.

Figure 9:
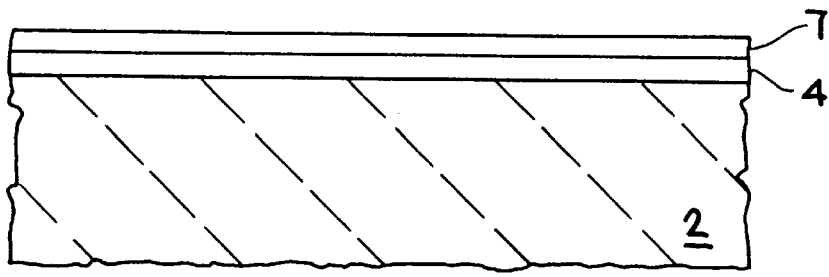
FIG. 9 is a fragmentary vertical cross-sectional view of a semiconductor substrate having a silicon oxide gate oxide layer thereon, and a layer of amorphous silicon formed over the gate oxide layer.
Figure 10:
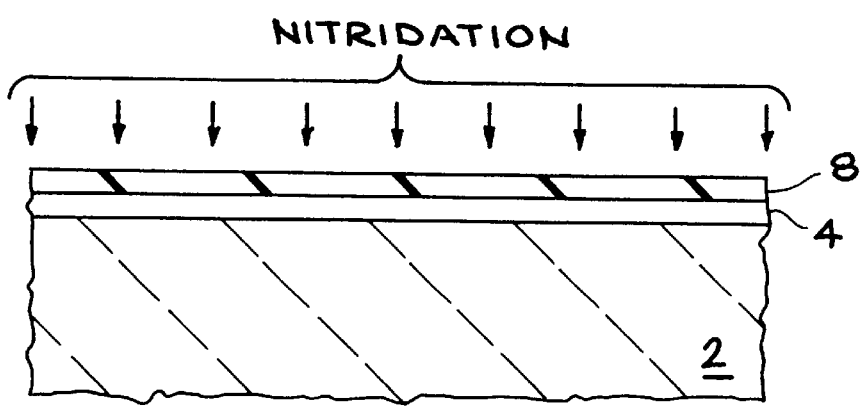
FIG. 10 is a fragmentary vertical cross-sectional view of the structure of FIG. 9 after nitridating the amorphous silicon layer to form a barrier layer of a silicon and nitrogen compound over the gate oxide layer.
Figure 11:
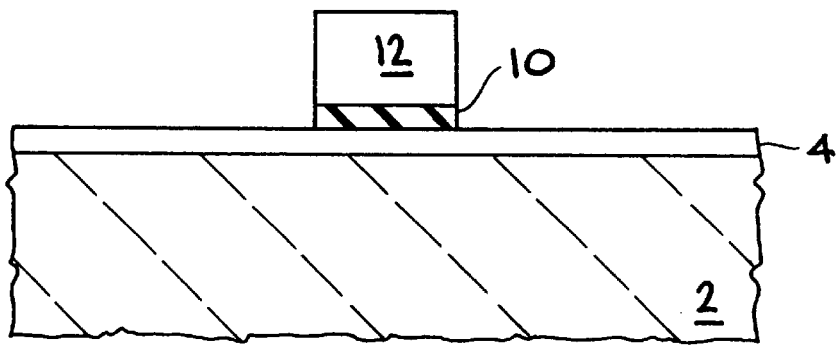
FIG. 11 is a fragmentary vertical cross-sectional view of the structure of FIG. 10 after forming a gate electrode over the silicon and nitrogen barrier layer, and then removing exposed portions of the barrier layer, but leaving the entire gate oxide layer over the semiconductor substrate.

Turning now to FIGS. 9–21, another embodiment of the invention is shown, wherein like structures will be shown with the same numerals. In FIG. 9, silicon oxide (gate oxide) layer 4 is formed over semiconductor substrate 2 and an amorphous silicon layer 7 is shown formed over gate oxide layer 4. Silicon layer 7 is nitridized, in accordance with one of the previously described nitridating conditions, to form nitridized silicon barrier layer 8 shown in FIG. 10, and polysilicon gate electrode 12 is then formed over barrier layer 8. The exposed portions of barrier layer 8 remaining are removed, leaving barrier layer portion 10 beneath gate electrode 12, as seen in FIG. 11. In this embodiment, however, the exposed portions of gate oxide layer 4 will be illustrated as not removed (to thereby illustrate the formation of the first silicon nitride spacers of this embodiment over gate oxide).

Figure 12:
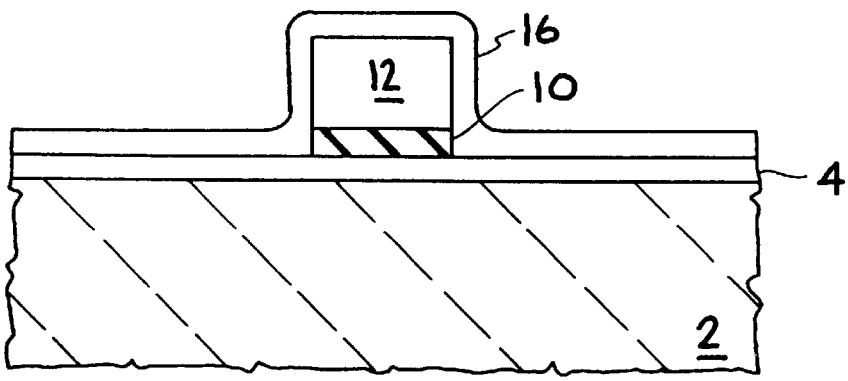
FIG. 12 is a fragmentary vertical cross-sectional view of the structure of FIG. 11 after forming a layer of amorphous silicon over the structure of FIG. 11.
Figure 13:
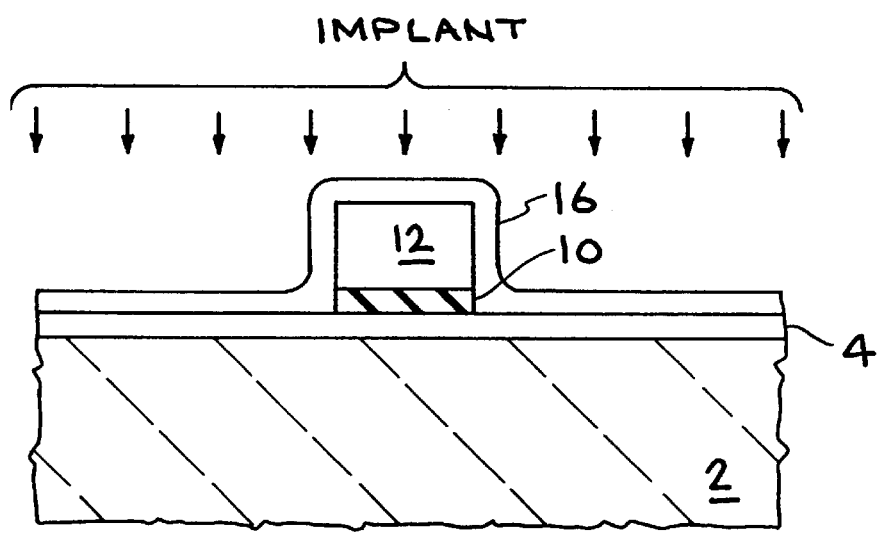
FIG. 13 is a fragmentary vertical cross-sectional view of the structure of FIG. 12 showing the amorphous silicon layer of FIG. 12 being subjected to an implant by a dopant which is subsequently utilized in the forming of doped regions between the source/drain regions and the channel region in the underlying substrate.

As in the previous embodiment, amorphous silicon layer 16 is then formed over the structure, as shown in FIG. 12. As seen in FIG. 13, amorphous silicon layer 16 is then subject to a first implantation with a suitable dopant such as described with respect to the first embodiment. However, unlike the first embodiment, the maximum dosage of this first implant is controlled so as to form in the substrate, after an annealing step, doped regions corresponding to heavily doped drain regions (HDD regions) or lightly doped drain regions (LDD regions), but less heavily doped than conventional source/drain regions. That is, the maximum dopant concentration, for example, for boron will not exceed about $5\times10^{19}$ atoms/cm$^3$, for arsenic will not exceed about $5\times10^{19}$ atoms/cm$^3$, and for phosphorus will not exceed about $5\times10^{19}$ atoms/cm$^3$.

It should be noted here that the presence of gate oxide layer 4 between implanted silicon layer 16 and substrate 2 may also be used in the control of the amount of dopant diffused into substrate 2 during this first set of implantation and diffusion steps.

Figure 14:
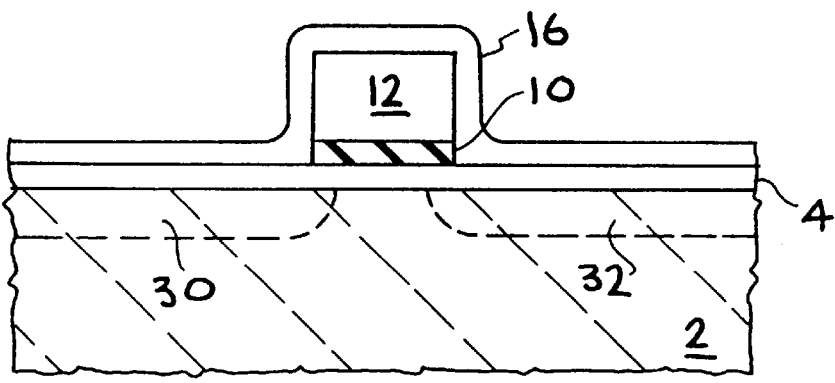
FIG. 14 is a fragmentary vertical cross-sectional view of the structure of FIG. 13 after annealing the structure to diffusion the dopant from the amorphous silicon layer into the substrate to form doped regions in the substrate, and to crystallize the layer of amorphous silicon of FIG. 12 into a layer of polysilicon.
Figure 15:
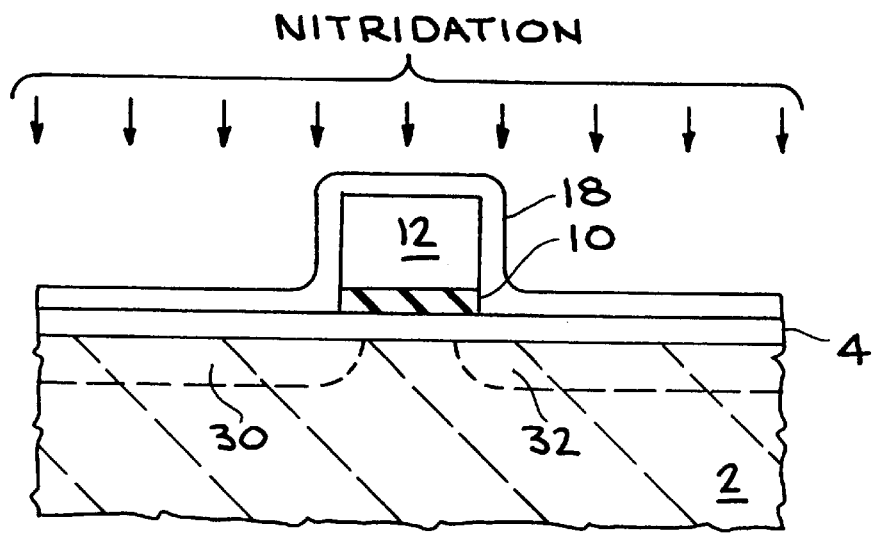
FIG. 15 is a fragmentary vertical cross-sectional view of the structure of FIG. 14 showing the polysilicon layer being nitridized to convert it to a silicon nitride layer.
Figure 16:
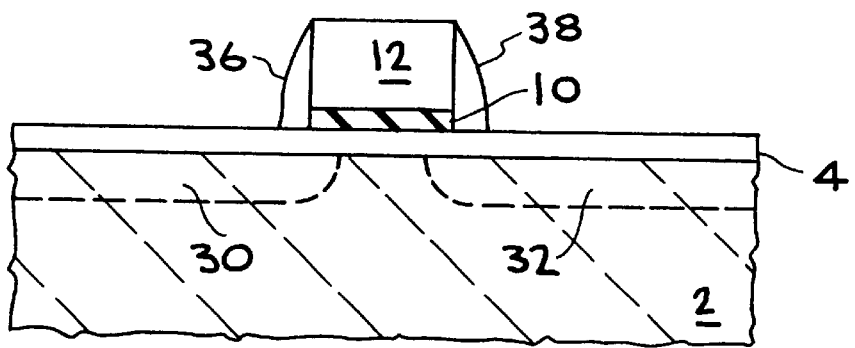
FIG. 16 is a fragmentary vertical cross-sectional view of the structure of FIG. 15, after subjecting the silicon nitride layer formed in FIG. 15 to an anisotropic etch to form first silicon nitride spacers on the sidewall of the polysilicon gate electrode.
Figure 17:
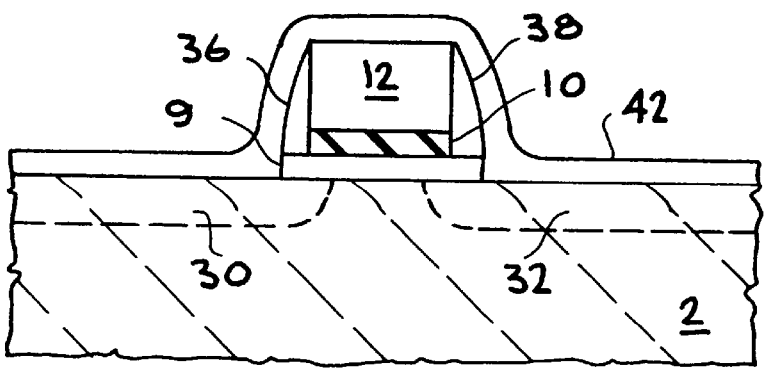
FIG. 17 is a fragmentary vertical cross-sectional view of the structure of FIG. 16 after forming a further layer of amorphous silicon over the structure of FIG. 16.

After the first implantation step shown in FIG. 13, the structure is annealed, under conditions as described above with respect to the previous embodiment, to diffuse the implanted dopant from implanted silicon layer 16 into substrate 2. Doped regions 30 and 32 are thereby formed in substrate 2, as shown in FIG. 14. As in the previous embodiment, the annealed silicon layer 16 (now comprising polysilicon due to crystallization during the anneal) is nitridized under one of the conditions previously described to form silicon nitride layer 18, as shown in FIG. 15, which is then subject to an anisotropic etch to form first silicon nitride spacers 36 and 38 on the sidewalls of polysilicon gate electrode 12 and over gate oxide layer 4, as shown in FIG. 16. The remaining exposed portions of gate oxide layer 4 are then removed, leaving gate oxide 9 beneath barrier layer portion 10 and silicon nitride spacers 36 and 38, as seen in FIG. 17.

Up to this point, this second embodiment closely resembles the first embodiment, except for the dosage of the implant into amorphous silicon layer 16 and the formation of first silicon nitride spacers over gate oxide layer 4. However, at this stage, a further amorphous silicon layer 42 is now formed over the entire structure, as also shown in FIG. 17.

Figure 18:
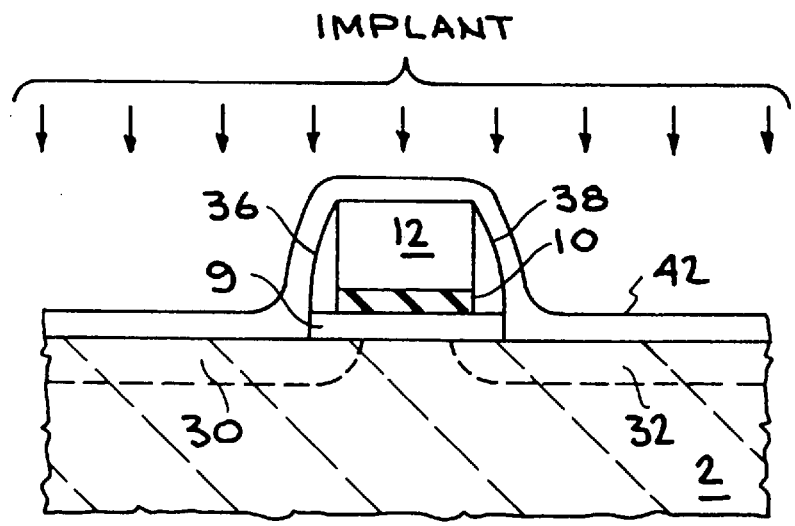
FIG. 18 is a fragmentary vertical cross-sectional view of the structure of FIG. 17 showing the further amorphous silicon layer of FIG. 17 being subjected to an implant by the same dopant, but at a higher dosage level than the dopant implantation into the amorphous silicon layer of FIG. 12.

This further amorphous silicon layer 42 is now implanted, as shown in FIG. 18, with a dopant, which may comprise the same dopant as previous implanted into amorphous silicon layer 16. However, the total dopant concentration of this second implant, for example, when boron is the dopant, will be about $1\times10^{20}$ atoms/cm$^3$, i.e., will range from about $5\times10^{19}$ atoms/cm$^3$ up to as high as $10^{21}$ atoms/cm$^3$. When arsenic is the dopant, the total dopant concentration of this second implant will be about $1\times10^{21}$ atoms/cm$^3$, i.e., will range from about $5\times10^{19}$ atoms/cm$^3$ up to as high as $1\times10^{21}$ atoms/cm$^3$; and when phosphorus is the dopant, the total dopant concentration of this second implant will be about $1\times10^{20}$ atoms/cm$^3$, i.e., will range from about $5\times10^{19}$ atoms/cm$^3$ up to as high as $1\times10^{21}$ atoms/cm$^3$.

Figure 19:
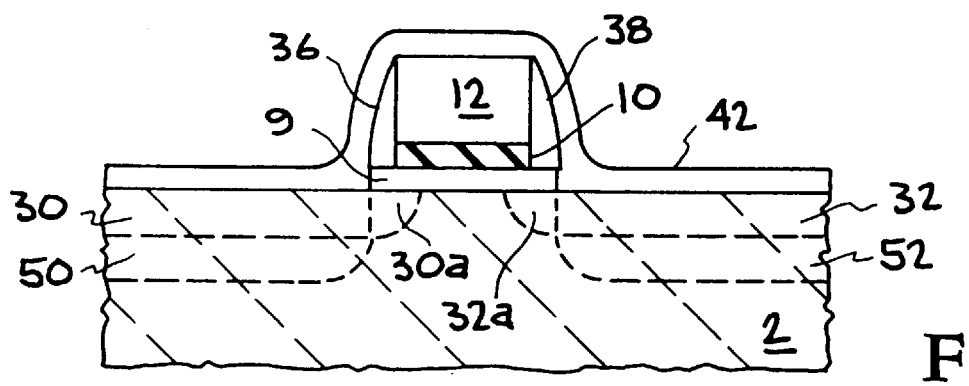
FIG. 19 is a fragmentary vertical cross-sectional view of the structure of FIG. 18 after annealing the structure to diffusion the dopant from the further amorphous silicon layer into the substrate to form doped source/drain regions in the substrate, and to crystallize the further amorphous silicon layer into a further polysilicon layer.

The structure is then subjected to a further anneal, which may be carried out under the same conditions as previously described, to diffuse the implanted dopant from further amorphous silicon layer 42 into substrate 2. This second anneal causes the dopant from implanted amorphous silicon layer 42 to diffuse down into substrate 2 forming source/drain regions 50 and 52, as shown in FIG. 19. It will be noted that source/drain regions 50 and 52 penetrate deeper into substrate 2 than previously diffused doped regions 30 and 32. This is because the first implantation (into silicon layer 16) is carried out, in this embodiment, at a lower dopant concentration than the implant into further silicon layer 42, and the diffusion is impeded by the presence of oxide layer 4.

At the same time, it will be noted in FIG. 19 that the source/drain regions 50 and 52 do not extend laterally under gate oxide portion 9 as far as doped regions 30 and 32 do. This is because first silicon nitride spacers 36 and 38 act as a shield during the second anneal to inhibit the extent of the lateral diffusion of the second dopant. That is, the second dopant, after diffusing vertically down into substrate 2 from implanted silicon layer 42, would have to travel laterally the width of silicon nitride spacers 36 and 38 before reaching the already doped region beneath gate oxide portion 9. This results in the creation of less heavily doped segments 30a and 32a beneath gate oxide portion 9 comprising HDD or LDD regions, depending upon the dosage concentration of the first implant (into silicon layer 16) in this embodiment.

Figure 20:
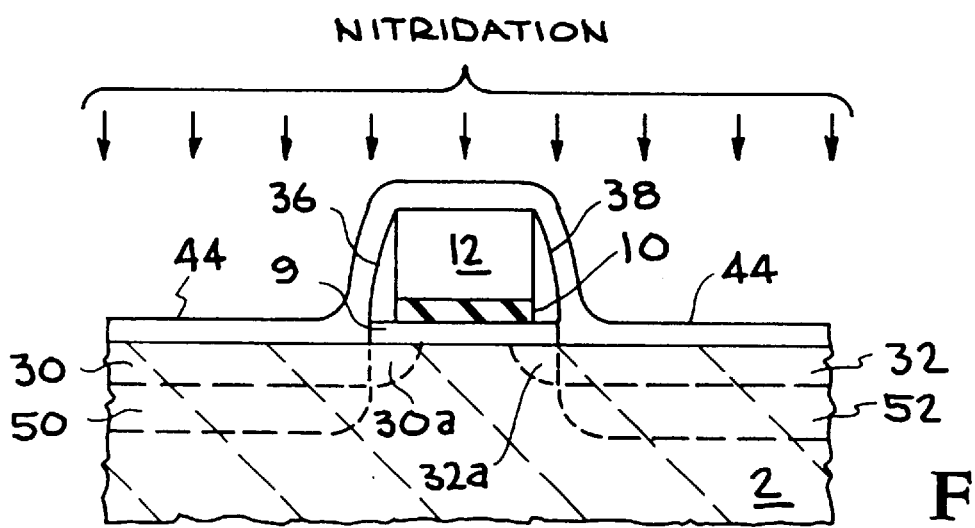
FIG. 20 is a fragmentary vertical cross-sectional view of the structure of FIG. 19 showing the further polysilicon layer being nitridized to convert it to a further silicon nitride layer.
Figure 21:
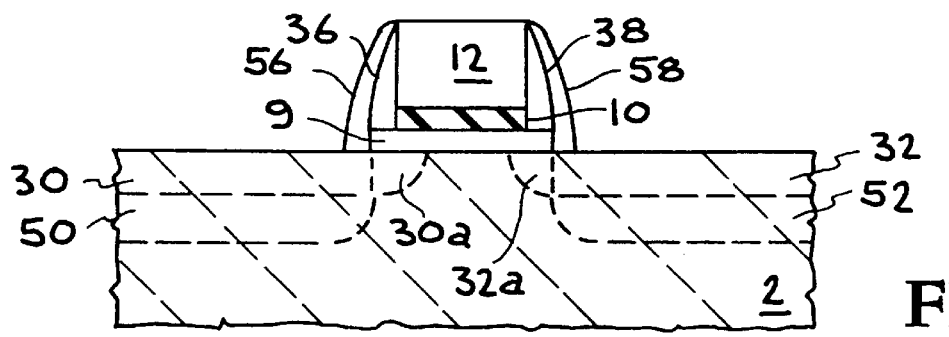
FIG. 21 is a fragmentary vertical cross-sectional view of the structure of FIG. 20, after subjecting the further silicon nitride layer formed in FIG. 20 to an anisotropic etch to form second silicon nitride spacers laterally adjacent the first set of silicon nitride spacers on the sidewall of the polysilicon gate electrode.

After formation of source/drain regions 50 and 52, separated from the channel region of substrate 2 beneath gate electrode 12 by HDD or LDD segments 30a and 32a, silicon layer 42 (which is now crystallized during the anneal to form polysilicon) is subject to a nitridation step, such as previously described, to form a nitridized silicon layer 44, as shown in FIG. 20. Nitridized silicon layer 44 is then subject to an anisotropic etch to form second silicon nitride spacers 56 and 58 adjacent and contiguous with first silicon nitride spacers 36 and 38, as shown in FIG. 21.

Figure 22:
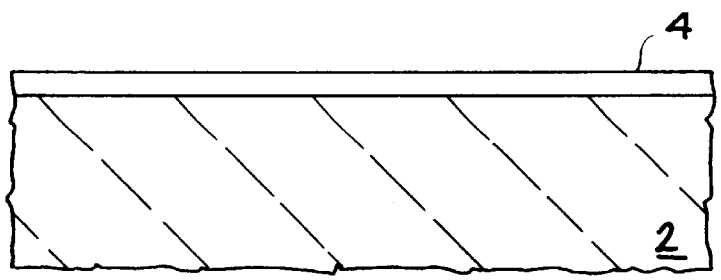
FIG. 22 is a fragmentary vertical cross-sectional view of a semiconductor substrate having a silicon oxide gate oxide layer thereon.
Figure 23:
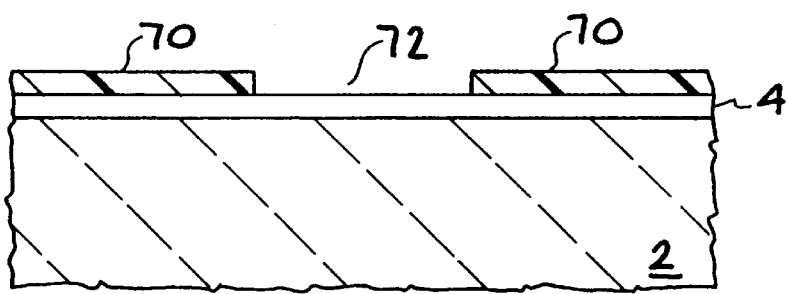
FIG. 23 is a fragmentary vertical cross-sectional view of the structure of FIG. 22 wherein a resist mask has been formed over the silicon oxide gate oxide layer.
Figure 24:
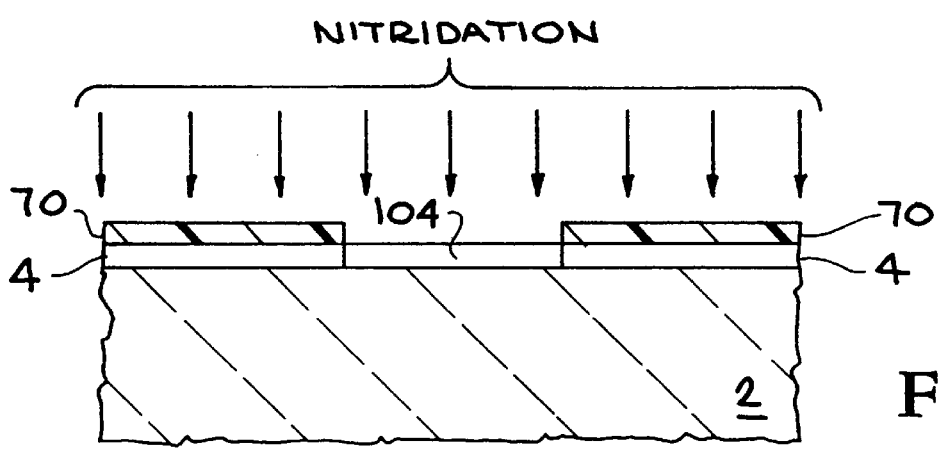
FIG. 24 is a fragmentary vertical cross-sectional view of the structure of FIG. 23 wherein the gate oxide layer exposed through the resist mask has been nitridized.

Turning now to FIGS. 22–30, yet another embodiment of the invention will be illustrated. In this embodiment, gate oxide layer 4 is first formed over substrate 2, as shown in FIG. 22, and a mask 70, such as a resist mask, is formed over gate oxide layer 4 on semiconductor substrate 2 to define an opening 72, as shown in FIG. 23, exposing a region of gate oxide layer 4 which is larger than a gate electrode to be subsequently formed thereon. This exposed portion of gate oxide layer 4 is then nitridized, resulting in the formation of nitridized gate oxide layer 104, as shown in FIG. 24.

Figure 25:
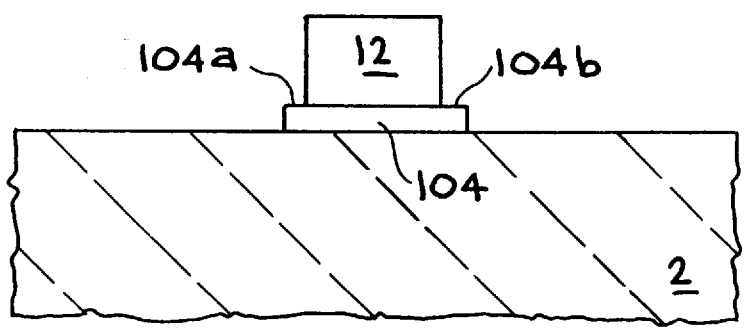
FIG. 25 is a fragmentary vertical cross-sectional view of the structure of FIG. 24 wherein the resist mask has been removed and a polysilicon gate electrode has been formed over a central portion of the nitridized gate oxide.

Mask 70 is then removed, together with the masked portions of gate oxide layer 4 which were not nitridized, leaving only nitridized gate oxide layer 104. Polysilicon gate electrode 12 is then formed over the central portion of gate oxide 104, leaving exposed portions 104a and 104b of nitridized gate oxide layer 104 adjacent gate electrode 12, as seen in FIG. 25. An amorphous silicon layer 90 is then formed over gate electrode 12, exposed portions 104a and 104b of gate oxide layer 104.

Figure 26:
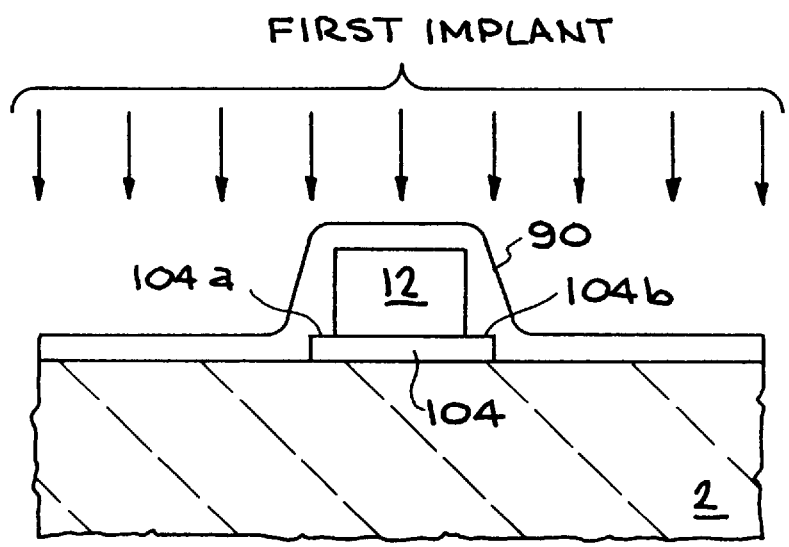
FIG. 26 is a fragmentary vertical cross-sectional view of the structure of FIG. 25 wherein a layer of amorphous silicon has been formed over the entire structure of FIG. 25, and a first implantation is being carried out with a first dopant on the amorphous silicon layer.
Figure 27:
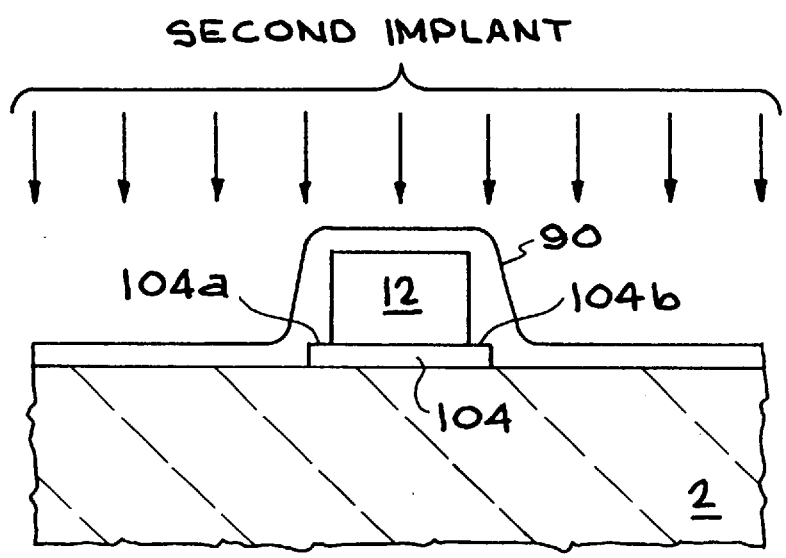
FIG. 27 is a fragmentary vertical cross-sectional view of the structure of FIG. 26 wherein a second implantation is being carried out on the amorphous silicon layer with a second dopant.

Silicon layer 90 is then subject to a first implant with a first dopant, as shown in FIG. 26. By way of illustration, and not of limitation, this first implantation, when formation of an NMOS structure is desired, may comprise an implant of arsenic at a first total dopant concentration. Silicon layer 90 is then implanted with a different dopant at a lower total dopant concentration, e.g., implanted with phosphorus at a lower total dopant concentration than the previous implantation with arsenic, as shown in FIG. 27. It will be noted, however, that there is no intervening annealing step between the two implantation steps. While such an intervening anneal could be carried out, it is not deemed necessary, and could indeed even be deleterious as will be seen.

Figure 28:
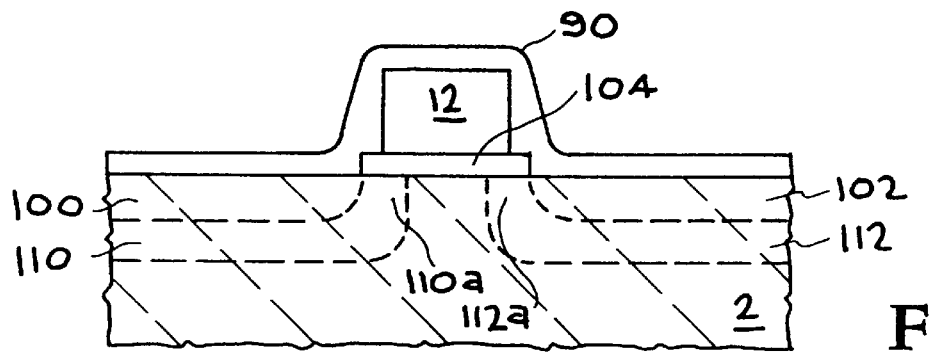
FIG. 28 is a fragmentary vertical cross-sectional view of the structure of FIG. 27 wherein the structure has been subjected to an anneal to convert the amorphous silicon layer to a polysilicon layer and to diffuse both dopants into the substrate; one dopant forming the source/drain regions in the substrate and the other dopant, having a lower concentration but a higher mobility, forming regions, between the source/drain regions and a channel region beneath the gate electrode, of lesser dopant concentration than the source/drain regions.

After the two dopant implant steps, the structure is subject to an anneal, which may be under the conditions previously described, to form the structure shown in FIG. 28, comprising shallow, but more heavily doped, source/drain regions 100 and 102, and deeper, but more lightly doped, regions 110 and 112, which also extend further laterally under nitridized gate oxide layer 104 to form more lightly doped segments 110a and 112a between source/drain regions 100 and 102 and the channel region formed in substrate 2 beneath gate electrode 12. By using a heavier total dopant concentration of arsenic (a larger dopant with less mobility) and a lighter total dopant concentration of phosphorus (a smaller dopant with more mobility), the more mobile phosphorus atoms migrate further laterally, during the anneal, to form less heavily doped segments 110a and 112a adjacent the channel region beneath gate electrode 12, while the more concentrated (but less mobile) arsenic atoms form the desired source/drain regions 100 and 102. Thus less heavily doped segments 110a and 112a (HDD regions or LDD regions—depending upon the concentration of dopant in the more mobile dopant implantation) can be formed to separate source/drain regions 100 and 102 from the channel region beneath gate electrode 12.

Figure 29:
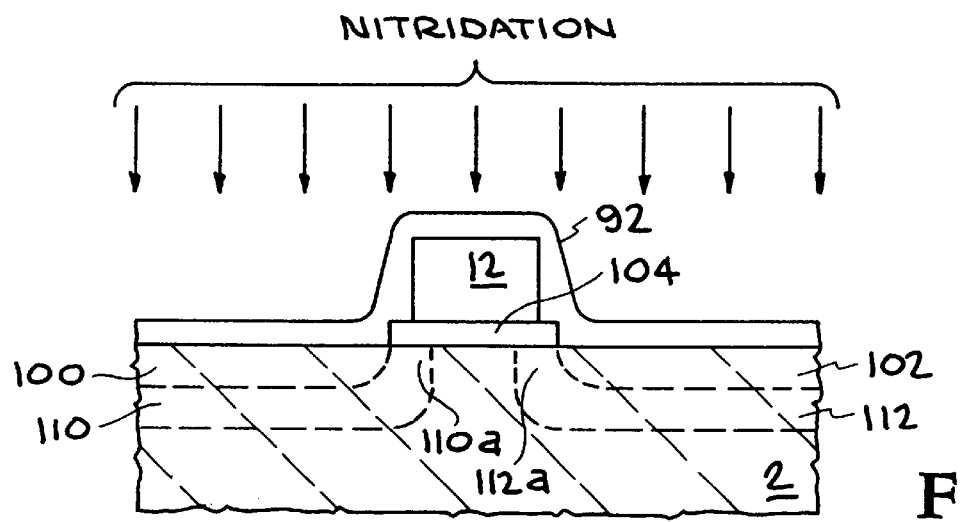
FIG. 29 is a fragmentary vertical cross-sectional view of the structure of FIG. 28 showing the polysilicon layer of FIG. 29 being nitridized to form a layer of a silicon nitride.
Figure 30:
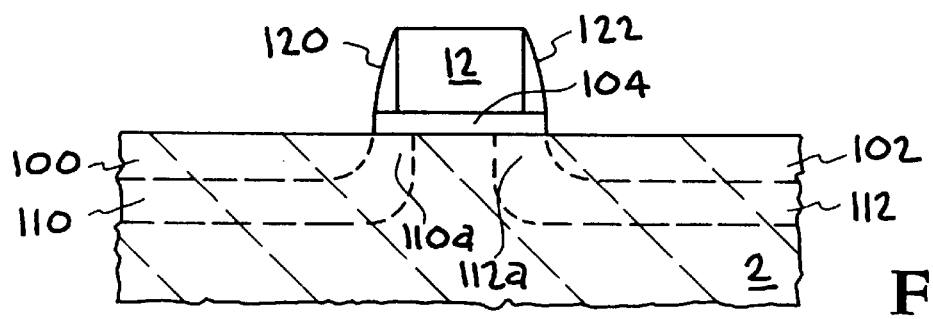
FIG. 30 is a fragmentary vertical cross-sectional view of the structure of FIG. 29 after subjecting the silicon nitride layer of FIG. 29 to an anisotropic etch to form silicon nitride spacers on the sidewalls of the polysilicon gate electrode.

After the annealing step to form source/drain regions 100 and 102, and the less heavily doped regions 110 and 112 (including less heavily doped segments 110a and 112a), silicon layer 90 may be subjected to a nitridating step, under the conditions previously described, to form nitridized silicon layer 92, as shown in FIG. 29. As in the previous embodiments, silicon layer 90, which has now crystallized to polysilicon, is nitridized under the previously described conditions, to form a nitridized silicon or silicon nitride layer 92. Nitride layer 92 is then subject to an anisotropic etch to form silicon nitride spacers 120 and 122, as shown in FIG. 30.

Thus, the invention provides a process for forming defect-free source/drain regions in single crystal semiconductor substrates using one or more overlying silicon layers as implant and outdiffusion layers to form the source/drain regions, as well as optionally using such silicon layers in forming less heavily doped regions between the source/drain regions and the channel region beneath the gate electrode, and then using the same one or more silicon layers as the source of silicon for the formation of silicon nitride spacers between the gate electrode and the source/drain regions in the substrate.

Having thus described the invention what is claimed is:

1. A process for forming an integrated circuit structure on a semiconductor substrate which comprises:
   a) forming a gate oxide layer over a single crystal semiconductor substrate;
   b) forming a dopant-implant barrier layer containing nitrogen and silicon over said single crystal semiconductor substrate;
   c) forming a polysilicon gate electrode over said barrier layer;
   d) removing exposed portions of said barrier layer remaining after formation of said gate electrode thereon;
   e) forming an amorphous silicon layer over said integrated circuit structure;
   f) implanting said amorphous silicon layer with a first dopant capable of forming source/drain regions in the underlying semiconductor substrate;
   g) annealing said amorphous silicon layer:
      1) to crystallize said amorphous silicon layer to form a polysilicon layer;
      2) to diffuse said implanted dopant from said silicon layer into said substrate to form said source/drain regions in said substrate; and
      3) to diffuse said dopant into said polysilicon gate electrode;
   h) then nitridating said polysilicon layer to convert said polysilicon layer into a silicon nitride layer; and
   i) then anisotropically etching said silicon nitride layer to form silicon nitride spacers on the sidewalls of said polysilicon gate electrode to electrically insulate said gate electrode from said source/drain regions in said substrate.

2. The process of claim 1 wherein said step of implanting said amorphous silicon layer with said first dopant further comprises implanting said amorphous silicon layer with a dopant selected from the group consisting of boron, phosphorus, and arsenic.

3. The process of claim 1 including the further steps of:
   a) forming a further amorphous silicon layer over said integrated circuit structure after said step of forming said first silicon nitride spacers;
   b) implanting said further amorphous silicon layer with a second dopant at a total dopant concentration higher than said first dopant and sufficient to form source/drain regions in said substrate upon subsequent annealing of said structure to diffuse said second dopant into said substrate;

c) annealing said structure to diffuse said second implanted dopant into said substrate to form said source/drain regions in said substrate and to convert said further amorphous silicon layer into a further polysilicon layer;

d) nitridating said further polysilicon layer to form a second layer of silicon nitride; and e) then anisotropically etching said second silicon nitride layer to form second silicon nitride spacers adjacent said first silicon nitride spacers on the sidewalls of said polysilicon gate electrode;

whereby said first dopant creates less heavily doped regions in said substrate between said source/drain regions and a channel region in said substrate beneath said polysilicon gate electrode.

4. The process of claim 3 wherein said first dopant and said second dopant comprise the same dopant material.

5. A The process of claim 1 including the further step of implanting said amorphous silicon layer with a second dopant after said step of implanting said amorphous silicon layer with said first dopant.

6. The process of claim 1 wherein said nitridating step further comprises exposing said polysilicon layer to a nitrogen plasma to convert said polysilicon layer into a silicon nitride layer.

7. The process of claim 1 wherein said step of forming said barrier layer further comprises nitridating said gate oxide layer, using a nitrogen plasma to form a barrier layer comprising a silicon, oxygen, and nitrogen compound.

8. The process of claim 1 wherein said step of forming said barrier layer further comprises the steps of:

a) forming a silicon layer over said previously formed gate oxide layer; and b) nitridating said silicon layer, using a nitrogen plasma to form said barrier layer comprising a silicon and nitrogen compound.

9. A process for forming an integrated circuit structure on a semiconductor substrate which comprises:

a) forming a dopant-implant barrier layer containing nitrogen and silicon over a single crystal semiconductor substrate;

b) forming a polysilicon gate electrode over said barrier layer;

c) removing exposed portions of said barrier layer;

d) forming a first amorphous silicon layer over said barrier layer and said polysilicon gate electrode;

e) implanting said first amorphous silicon layer with a first dopant capable of forming doped regions in the underlying semiconductor substrate which are less heavily doped than source/drain regions subsequently formed in said substrate;

f) annealing said first amorphous silicon layer:
  i) to form a first polysilicon layer;
  ii) to diffuse said implanted first dopant from said first silicon layer through said barrier layer into said substrate to form said doped regions in said substrate; and
  iii) to diffuse said implanted first dopant into said polysilicon gate electrode;

g) then nitridating said first polysilicon layer, using a nitrogen plasma to convert said first polysilicon layer into a first silicon nitride layer;

h) then anisotropically etching said first silicon nitride layer to form first silicon nitride spacers on the sidewalls of said polysilicon gate electrode;

i) forming a second layer of amorphous silicon over said structure;

j) implanting said second amorphous silicon layer with a second dopant capable of forming source/drain regions in the underlying semiconductor substrate;

k) annealing said second amorphous silicon layer:
  i) to form a second polysilicon layer; and
  ii) to diffuse said implanted second dopant from said second silicon layer through said barrier layer into said substrate to form said source/drain regions in said substrate;

l) then nitridating said second polysilicon layer, using a nitrogen plasma to convert said second polysilicon layer into a second silicon nitride layer; and m) then anisotropically etching said second silicon nitride layer to form second silicon nitride spacers adjacent said first silicon nitride spacers on the sidewalls of said polysilicon gate electrode;

whereby source/drain regions are formed in said substrate separated from a channel region in said substrate beneath said gate electrode by less heavily doped regions in said substrate.

10. The process of claim 9 wherein said step of forming said barrier layer further comprises:

a) forming a gate oxide layer over said single crystal semiconductor substrate; and b) nitridating said gate oxide layer, using a nitrogen plasma to form a barrier layer comprising a silicon, oxygen, and nitrogen compound.

11. The process of claim 9 wherein said step of forming said barrier layer further comprises the steps of:

a) forming a gate oxide layer over said single crystal semiconductor substrate;

b) forming a silicon layer over said gate oxide layer; and c) nitridating said silicon layer, using a nitrogen plasma to form a barrier layer comprising a silicon and nitrogen compound over said gate oxide layer.

12. A process for forming an integrated circuit structure on a semiconductor substrate which comprises:

a) forming a dopant-implant barrier layer containing nitrogen and silicon over a first area of a single crystal semiconductor substrate;

b) forming a polysilicon gate electrode over a central portion of said barrier layer of smaller area than said first area;

c) forming an amorphous silicon layer over said substrate, including said polysilicon gate electrode and exposed portions of said barrier layer;

d) implanting said amorphous silicon layer with a first dopant at a first concentration capable of forming source/drain regions in the underlying single crystal semiconductor substrate;

e) implanting said amorphous silicon layer with a second dopant having a faster diffusion rate than said first dopant, but at a second concentration smaller than said first concentration, and capable of forming doped regions in said substrate less heavily doped than said source/drain regions;

f) annealing said amorphous silicon layer:
  i) to form a polysilicon layer;
  ii) to diffuse said implanted first and second dopants from said silicon layer into said substrate to form said source/drain regions and said less heavily doped regions in said substrate; and iii) to diffuse said dopants into said polysilicon gate electrode;

whereby said faster diffusing second dopant will laterally diffuse toward a channel region in said substrate beneath said polysilicon gate electrode at a faster rate than said first dopant to thereby form said less heavily doped regions between said channel region and said source/drain regions;

g) then nitridating said polysilicon layer, using a nitrogen plasma to convert said polysilicon layer into a silicon nitride layer; and h) then anisotropically etching said silicon nitride layer to form silicon nitride spacers on the sidewalls of said polysilicon gate electrode to electrically insulate said gate electrode from said source/drain regions in said substrate.

13. The process of claim 12 wherein said step of forming said barrier layer further comprises:

a) forming a gate oxide layer over said single crystal semiconductor substrate; and b) nitridating said gate oxide layer, using a nitrogen plasma to form a barrier layer comprising a silicon, oxygen, and nitrogen compound.

14. The process of claim 12 wherein one of said first and second dopants comprises arsenic and the other of said first and second dopants comprises phosphorus.

15. The process of claim 14 wherein said arsenic dopant is implanted into said amorphous silicon layer at a higher total dopant concentration than said phosphorus dopant.

16. A process for forming an integrated circuit structure on a semiconductor substrate which comprises:

a) forming a gate oxide layer over a single crystal semiconductor substrate;

b) forming a silicon layer over said gate oxide layer;

c) nitridating said silicon layer to form a dopant-implant barrier layer comprising a silicon and nitrogen compound over said gate oxide layer;

d) forming a polysilicon gate electrode over said barrier layer;

e) removing all of said barrier layer not under said polysilicon gate electrode;

f) forming an amorphous silicon layer over exposed portions of said integrated circuit structure;

g) implanting said amorphous silicon layer with a first dopant capable of forming doped regions in the underlying semiconductor substrate;

h) annealing said amorphous silicon layer:

1) to crystallize said amorphous silicon layer into a polysilicon layer;

2) to diffuse said implanted first dopant from said silicon layer into said substrate to form said doped regions in said substrate; and 3) to diffuse said first dopant into said polysilicon gate electrode;

i) then nitridating said polysilicon layer to convert said polysilicon layer into a first silicon nitride layer; and j) then anisotropically etching said silicon nitride layer to form first silicon nitride spacers on the sidewalls of said polysilicon gate electrode to electrically insulate said gate electrode from said doped regions in said substrate.

17. The process of claim 16 including the further step of removing all of said gate oxide layer exposed by said step of removing all of said barrier layer not under said polysilicon gate electrode.

18. A process for forming an integrated circuit structure on a semiconductor substrate which comprises:

a) forming a gate oxide layer of silicon oxide over a single crystal semiconductor substrate;

b) nitridating said gate oxide layer to form a dopant-implant barrier layer comprising silicon, oxygen, and nitrogen over said single crystal semiconductor substrate;

c) forming a polysilicon gate electrode over said barrier layer;

d) removing all of said barrier layer not under said polysilicon gate electrode;

e) forming an amorphous silicon layer over exposed portions of said integrated circuit structure;

f) implanting said amorphous silicon layer with a first dopant capable of forming doped regions in the underlying semiconductor substrate;

g) annealing said amorphous silicon layer:

1) to crystallize said amorphous silicon layer into a polysilicon layer;

2) to diffuse said implanted first dopant from said silicon layer into said substrate to form said doped regions in said substrate; and 3) to diffuse said first dopant into said polysilicon gate electrode;

h) then nitridating said polysilicon layer to convert said polysilicon layer into a first silicon nitride layer; and i) then anisotropically etching said silicon nitride layer to form first silicon nitride spacers on the sidewalls of said polysilicon gate electrode to electrically insulate said gate electrode from said doped regions in said substrate.

* * * * *